(12) United States Patent
Shan

(10) Patent No.: US 11,067,599 B2
(45) Date of Patent: Jul. 20, 2021

(54) PROBE DEVICE

(71) Applicant: HKC CORPORATION LIMITED, Shenzhen (CN)

(72) Inventor: Jianfeng Shan, Shenzhen (CN)

(73) Assignee: HKC CORPORATION LIMITED, Shenzhen (CN)

(*) Notice: Subject to any disclaimer, the term of this patent is extended or adjusted under 35 U.S.C. 154(b) by 8 days.

(21) Appl. No.: 16/648,777

(22) PCT Filed: Dec. 20, 2017

(86) PCT No.: PCT/CN2017/117316
§ 371 (c)(1),
(2) Date: Mar. 19, 2020

(87) PCT Pub. No.: WO2019/056624
PCT Pub. Date: Mar. 28, 2019

(65) Prior Publication Data
US 2020/0271691 A1    Aug. 27, 2020

(30) Foreign Application Priority Data
Sep. 25, 2017 (CN) .......................... 201710875612.9

(51) Int. Cl.
*G01R 1/067* (2006.01)

(52) U.S. Cl.
CPC ..... *G01R 1/06766* (2013.01); *G01R 1/06722* (2013.01)

(58) Field of Classification Search
CPC .................... G01R 1/06766; G01R 1/06722
See application file for complete search history.

(56) References Cited

U.S. PATENT DOCUMENTS 3,577,208 A * 5/1971 Petrick ................ H01R 4/64
361/222
5,877,618 A  3/1999 Luebke et al.
(Continued)

FOREIGN PATENT DOCUMENTS

CN    1295252 A    5/2001
CN    201789125 U    4/2011
(Continued)

OTHER PUBLICATIONS

International Search Report in corresponding PCT application No. PCT/CN2017/117316, dated Jun. 28, 2018.
(Continued)

*Primary Examiner* — Paresh Patel
(74) *Attorney, Agent, or Firm* — Westbridge IP LLC

(57) ABSTRACT

An embodiment of the present disclosure discloses a probe device including: a base, including a main body, a cavity formed in the main body, and a through hole defined in the main body and communicating with the cavity; a probe, including a main part, a probe head defined at one end of the main part, and a mounting portion defined at the other end of the main part, the mounting portion being inserted into the cavity via the through hole; and a conductive member, disposed in the cavity and defined on the mounting portion, allowing the mounting portion to be caught in the cavity. The conductive member is in contact with the probe device to release the charge of the probe accumulated during operation of the probe, when the probe device is not in operation.

6 Claims, 4 Drawing Sheets

(56) References Cited

U.S. PATENT DOCUMENTS

2004/0137800 A1\* 7/2004 Jing .................. H01R 13/2421
439/700
2016/0154024 A1 6/2016 Miyagawa
2020/0096540 A1\* 3/2020 Huang ............... G01R 1/06716

FOREIGN PATENT DOCUMENTS

| CN | 102110629 A | 6/2011 |
| --- | --- | --- |
| CN | 204348991 U | 5/2015 |
| CN | 204964934 U | 1/2016 |
| CN | 207248943 U | 4/2018 |

OTHER PUBLICATIONS

Written Opinion in corresponding PCT application No. PCT/CN2017/117316, dated Jun. 28, 2018.

\* cited by examiner

PROBE DEVICE

CROSS-REFERENCE TO RELATED APPLICATION

This application is a national stage of International Application No. PCT/CN2017/117316, filed on Dec. 20, 2017, which claims priority to Chinese Patent Application No. 201710875612.9, filed on Sep. 25, 2017. Both of the aforementioned applications are hereby incorporated by reference in their entireties.

FIELD OF THE DISCLOSURE

The present disclosure relates to the field of display technology, and in particular, to a probe device.

BACKGROUND OF THE DISCLOSURE

Nowadays, Liquid crystal display panel has become an important display platform in modern IT and video products. The principle for driving the display panel mainly includes the following steps. R/G/B compression signals, control signals, and power source are connected with a connector of PCB board by the system board via signal wire. The input data is processed by the Timing Controller (TCON), and the processed data is then coupled to the display area of the display panel via a source-chip on film (S-COF) and a gate-chip on film (G-COF), so that the display panel LCD obtains its required power and signals. Such a driving structure further includes a Fan Out Area defined at the edge of the display panel, scan lines and data lines of the display area are respectively connected to the S-COF chip and the G-COF chip via the fan-out area. Therefore, the required power and signals obtained by the display panel LCD is the ones output by transmitting system board after the system board connecting with the connector of PCB via the signal wires. In order to avoid damage on the connector of PCB caused by the manual insertion and removal of the signal wires in daily use, as well as to improve the production automation of factory and to improve the production efficiency, an Auto Contact System is introduced to the factory production line. Therefore, the R/G/B compression signal, the control signal, and the power source can be transmitted directly by contacting a metal probe device with the testing point on PCB, instead of inputting them into PCB by connecting the signal wire with the connector.

The method to directly transmit the power, signals from the system board by contacting the mental probe device with the testing point on PCB can avoid damage on PCB induced by manual insertion and removal of signal wire, as well as improve the production efficiency of the display. However, a long-term use of the metal probe device may cause charge accumulation on the metal probe device and eventually cause Electro-Static Discharge (ESD) and damage the components. The Electro-Static Discharge refers to charge transfer caused by objects having different electrostatic potentials getting close to each other or directly contacting each other. That is to say, a metal probe device that has accumulated a large amount of charge inevitably generates static electricity when it contacts a test point on the PCB, causing Electro-Static Discharge and transient voltage of thousands volts, which leads to electrostatic damage to the circuit board and making the Liquid crystal display panel out of operation.

Therefore, designing a new Auto Contact probe device which can release the charge of the probe accumulated due to long-term contact with the test point on circuit board, and thereby reduce effectively the possibility of Electro-Static Discharge and improve production, is a technical problem that needs to be solved by those skilled in the art.

SUMMARY OF THE DISCLOSURE

An embodiment of the present disclosure is to provide a probe device, the probe of the probe device can effectively release the charge of the probe accumulated due to long-term operation contacting a test point on the circuit board, because of the structure of the probe device including a conductive member, a conductive contact for contacting the conductive member to release the charge, and an elastic member for controlling whether the probe device is to release the charge.

In order to realize the above aim, an embodiment of the present disclosure provides a probe device, the probe device includes:

a base, including a main body, a cavity formed in the main body, a conductive contact grounded and defined on the main body, and a through hole defined in the main body and communicating with the cavity;

a probe which includes a main part, a probe head defined at one end of the main part, and a mounting portion defined at the other end of the main part, the mounting portion is inserted into the cavity of the base via the through hole; and a conductive member which is disposed in the cavity and defined on the mounting portion of the probe, allowing the mounting portion to be caught in the cavity;

the conductive member contacts the conductive contact to release the charge of the probe accumulated during operation of the probe, when the probe device is not in operation.

An embodiment of the present disclosure also provides another probe device, the probe device includes:

a base, including a main body, a cavity formed in the main body, a conductive contact grounded and defined on the main body, and a through hole defined in the main body and communicating with the cavity;

a probe, including a main part, a probe head defined at one end of the main part, and a mounting portion defined at the other end of the main part, the mounting portion is inserted into the cavity of the base via the through hole;

a conductive member, disposed in the cavity and defined on the mounting portion of the probe, allowing the mounting portion to be caught in the cavity; and an elastic member disposed in the cavity, one end of the elastic member is connected to the main body at the side away from the through hole, and the other end of the elastic member is connected with the mounting portion, and when the probe is in operation, the elastic member generates compressive deformation to separate the conductive member from the conductive contact; the conductive contact is defined on bottom of two opposite sidewalls of the main body, and a through opening for disposing the conductive contact is defined in each the bottom of the opposite sidewalls, and the conductive contact is shaped as arcuate cylinder, the inner side the conductive contact is flush with the sidewall of the cavity;

The conductive member contacts the conductive contact to release the charge of the probe accumulated during operation of the probe, when the probe device is not in operation.

In the embodiment of the present disclosure, by adding the structures of a conductive member, a conductive contact for contacting the conductive member to release the charge, and an elastic member for controlling whether the probe device is to release the charge, it is realized that the probe of the probe device effectively release the charge of the probe accumulated during operation of the probe contacting the test point on the circuit board, and therefore decrease the possibility of occurrence of Electro-Static Charge effectively and increase the yield rate.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only about some embodiments of the present invention, and persons of ordinary skill in the art can derive other drawings from the accompanying drawings without creative efforts.

DETAILED DESCRIPTION OF THE EMBODIMENTS

The technical solutions of the embodiments of the present disclosure will be clearly and completely described in the following with reference to the accompanying drawings. It is obvious that the embodiments to be described are only a part rather than all of the embodiments of the present disclosure. All other embodiments obtained by persons skilled in the art based on the embodiments of the present invention without creative efforts shall fall within the protection scope of the present invention.

It is to be understood that, the terms "include" and "comprise" in the present disclosure indicate that the described feature, integrity, step, operation, element and/or subassembly do exist, not excluding the exist or addition of one or plural other feature, integrity, step, operation, element, subassembly and/or the combination thereof.

It is also to be understood that, the terms described in the present disclosure are only for description of specific embodiment, rather than limiting the scope of the disclosure. As described in the specification and claims of the present disclosure, "a", "one" and "this" is used for description of subject including the plural form, unless other situation is clearly defined in the context.

In practice, the present disclosure can be implemented in various forms. For example, the display screen described in the embodiments includes without limitation the display screens such as film transistor liquid crystal display screen (LCD), organic light-emitting diode display screen (OLED), quantum dot display screen (QLED), plasma display screen, and cathode radial tube display screen (CRT).

Figure 1:
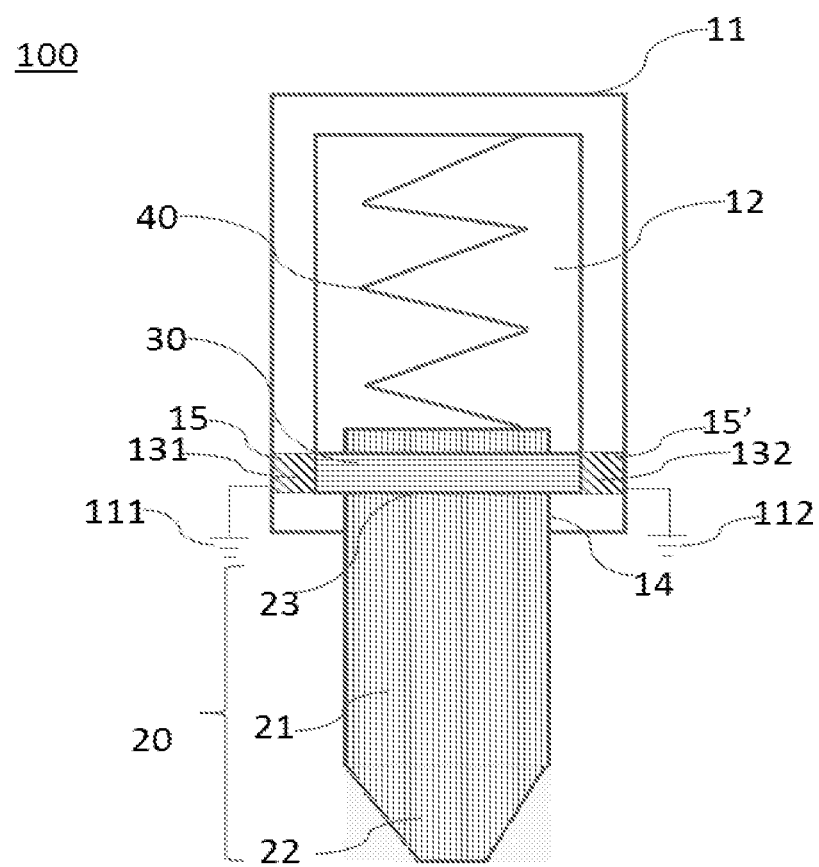
FIG. 1 is a cross-section diagram of the probe device according to a first embodiment of the present disclosure.

Please make reference to FIG. 1, a diagram of the probe device according to a first embodiment of the present disclosure. In the present embodiment, the probe device is provided with base 10, probe 20, conductive member 30, and elastic member 40 defined on the probe device.

The base 10 includes a main body 11, a cavity 12 formed in the main body 11, a conductive contact 131 and 132 grounded and defined on the main body 11 and to be grounded, and a through hole 14 defined in the main body 11 and communicating with the cavity 12. The base 10 is defined above the probe 20. In the embodiment, the base 10 is a hollow cylinder, and in other viable embodiments, it may be a hollow rectangular cylinder. The base 10 may be made of insulting material such as plastic. It is designed for fixation of the probe 20, preventing the probe 20 from swaying or the situation alike when contacting the test point on the circuit board. The through opening 15 and 15' are provided in the bottom of the two opposite sidewalls of the base 10 respectively, for disposition of the conductive contact 131 and 132, which can be made of conductive material such as metal. In this embodiment, the conductive contact is an arcuate cylinder, and the inner sides of the conductive contact 131 and 132 are flush with the sidewalls of the cavity 12 respectively, and the outer side of conductive contact 131 and 132 are flush with the outer sidewalls of the main body 11 respectively. By connecting the conductive contact 131 and 132 to the ground lines 111 and 112 respectively, the charge of the probe 20 accumulated is released to conduct to the ground, when the conductive member 30 contacts the conductive contact 131 and 132.

The probe 20 includes a main part 21, a probe head 22 defined at one end of the main part 21, and a mounting portion 23 defined at the other end of the main part 21, the mounting portion 23 is inserted into the cavity 12 of the base 10 via the through hole 14, and matches the through hole 14 in size. The probe 20 is a metal probe, the probe head 22 is used to contact the test point on the circuit board, transmitting power and signals directly. The mounting portion 23 is disposed in the cavity 12 of the base 10 for fixation of the conductive member 30. The mounting portion 23 is caught in the cavity 12. The outer diameter of the conductive member 30 is larger than the size of the through hole.

The conductive member 30 is disposed in the cavity 12, as well as on the mounting portion 23 of the probe 20, allowing the mounting portion 23 to be caught in the cavity 12. When the probe device 100 is not in operation, the conductive member 30 contacts the conductive contact 131 and 132 to release the charge of the probe 20 accumulated during operation of the probe 20. In the embodiment, the conductive member 30 is a conductive ring shaped as torus. It is sleeved on the mounting portion 23 of the probe 20, the probe 20 is shaped as arcuate cylinder and the outer diameter of the conductive ring matches the size of the sidewall of the cavity 12. Also, the conductive contact 131 and 132, being an arcuate cylinder, are flush with the sidewalls of the cavity 12, thereby matches with the outer diameter of the conductive ring. It greatly enlarges the fitting surface between the conductive contacts 131 and 132 with the conductive ring, thereby increasing the charge conduction rate and speeding up the release of the accumulated charge.

The elastic member 40 is disposed in the cavity 12, one end of the elastic member 40 is connected to the main body 11 away from the through hole 14, and the other end of the elastic member 40 is connected with the mounting portion 23 of the probe 20. It is used for separation of the conductive member from the conductive contact by generating compressive deformation when the probe is in operation. In this embodiment, the elastic member 40 is a spring coil. For example, when the probe 20 contacts the test point on the circuit board, the circuit board comes to generate an upward bearing capacity on the probe 20, causing the elastic member 40 compressively deformed to make the probe 20 and the conductive member 30 slide upward along the cavity 12. Due to the fixation of the conductive contacts 131 and 132, the conductive member 30 separates from the conductive contact 131 and 132 when sliding upward because of upward bearing.

In above embodiment, members like the conductive contact 131 and 132, and the conductive member 30 are defined according to the structure of the probe 20, thereby a grounded closed circuit is formed to conduct the charge accumulated during operation of the probe to the ground via the conductive contact 131 and 132, which decrease the possibility of occurrence of Electro-Static Charge effectively and increase the yield rate of Auto Contact.

Figure 2:
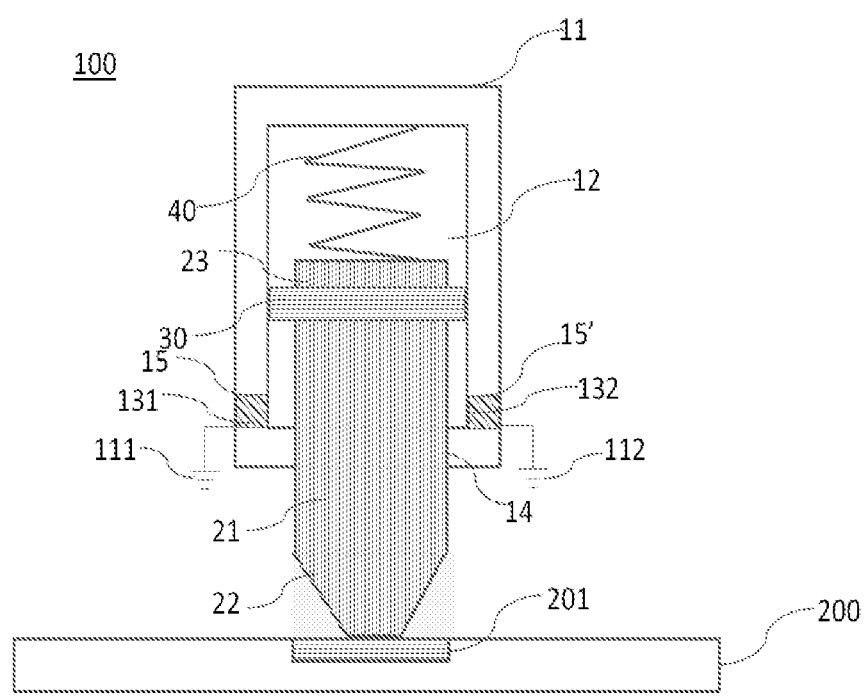
FIG. 2 is a cross-section diagram of the probe device in operation according to a first embodiment of the present disclosure.

Please make reference to FIG. 2, which is a diagram of the probe device provided by the first embodiment of the present disclosure. In this embodiment, the probe device 100 contacts the circuit board 200 to transmit power and signals. The probe device 100 is designed with base 10, probe 20, conductive member 30, elastic member 40, as well as circuit board 200 and test point area 201, defined on the probe device 100.

The base 10 includes a main body 11, a cavity 12 formed in the main body 11, a conductive contact 131 and 132 defined on the main body 11 and to be grounded, and a through hole 14 defined in the main body 11 and communicating with the cavity 12. The base 10 is defined above the probe 20. In the embodiment, the base 10 is a hollow cylinder, and in other viable embodiments, it may be a hollow rectangular cylinder. The base 10 may be made of insulting material such as plastic. It is designed for fixation of the probe 2, preventing the probe 20 from swaying or the situation alike when contacting the test point on the circuit board. Through opening 15 and 15' are provided in the bottom of the two opposite sidewalls of the base 10 respectively, for disposition of the conductive contact 131 and 132, which can be made of conductive material such as metal. In this embodiment, the conductive contact is an arcuate cylinder, and the inner sides of the conductive contact 131 and 132 are flush with the sidewalls of the cavity 12 respectively, and the outer sides of the conductive contact 131 and 132 are flush with the outer sidewall of the main body 11. The conductive contact 131 and 132 are connected to the ground lines 111 and 112 respectively, so that the charge of the probe 20 accumulated can be released to conduct to the ground, when the conductive member 30 contacts the conductive contact 131 and 132.

The probe 20 includes a main part 21, a probe head 22 defined at one end of the main part 21, and a mounting portion 23 defined at the other end of the main part 21, the mounting portion 23 is inserted into the cavity 12 of the base 10 via the through hole 14, and matches the through hole 14 in size. The probe 20 is a metal probe, the probe head 22 is used to contact the test point on the circuit board for direct transmission of power and signals. The mounting portion 23 is disposed in the cavity 12 of the base, for fixed connection of the conductive member 30. The mounting portion 23 is caught in the cavity 12, the outer diameter of the mounting portion 23 is larger than that of the through hole.

The conductive member 30 is disposed in the cavity 12, as well as on the mounting portion 23 of the probe 20, allowing the mounting portion 23 to be caught in the cavity 12. When the probe device 100 is not in operation, the conductive member 30 contacts the conductive contact 131 and 132 to release the charge of the probe 20 accumulated during operation of the probe 20. In the embodiment, the conductive member 30 is a conductive ring shaped as a torus, being sleeved on the mounting portion 23 of the probe 20. The probe 20 is a cylinder, and the outer diameter of the conductive ring matches the size of the cavity 12. Moreover, due to that the conductive contact 131 and 132 are shaped as circular arc and are flush with the sidewall of the cavity 12, the conductive contact 131 and 132 matches the outer diameter of the conductive ring, enlarging the fitting surface between the conductive contact 131 and 132 and the conductive ring greatly, which thereby increases the rate of charge conduction and release of the accumulated charge.

The elastic member 40 is disposed in the cavity 12, and one end of the elastic member 40 is connected to the main body 11 away from the through hole, and the other end of the elastic member 40 is connected with the mounting portion 23, and when the probe 20 is in operation, the elastic member generates compressive deformation to separate the conductive member 30 from the conductive contact 131 and 132. In this embodiment, the elastic member 40 is a spring coil. For example, when the probe 20 contacts the test point on the circuit board, the circuit board comes to generate an upward bearing capacity on the probe 20, causing the elastic member 40 compressively deformed to make the probe 20 and the conductive member 30 slide upward along the cavity 12. Due to the fixation of the conductive contacts 131 and 132, the conductive member 30 separates from the conductive contact 131 and 132 when sliding upward because of upward bearing.

In above embodiment, the probe device 100 further includes a elastic member 40, which is used to recognize whether the probe 20 is in operation or not. When the probe device 100 is not in operation, the probe 20 keeps suspending, and the conductive member 30 contacts the conductive contact 131 and 132 defined on the bottom of the two opposite sidewalls of the main body, releasing the charge accumulated during operation of the probe. The conductive member is situated at a first place. When the probe device 100 is in operation, the probe 20 contacts with the test point area 201 on the circuit board 200, and the probe 20 comes to be subjected to an upward bearing capacity by the circuit board 200, the conductive member 30 moves upward in the cavity 12 to a second position, separating from the conductive contacts 131 and 132, and a ground closed loop cannot be formed. Thereby, the accumulated charge on the probe 20 cannot be conducted to the conductive contacts 131 and 132 via the conductive member 30, and thereby cannot be conducted to the ground. Thereby, regular operation of the probe device 100 is secured that the controlling signals and power of the system board may be transmitted via the probe device 100. The conductive member 30 follows the probe 20 to move back and forth between the first position and the second position in the cavity 12.

Figure 3:
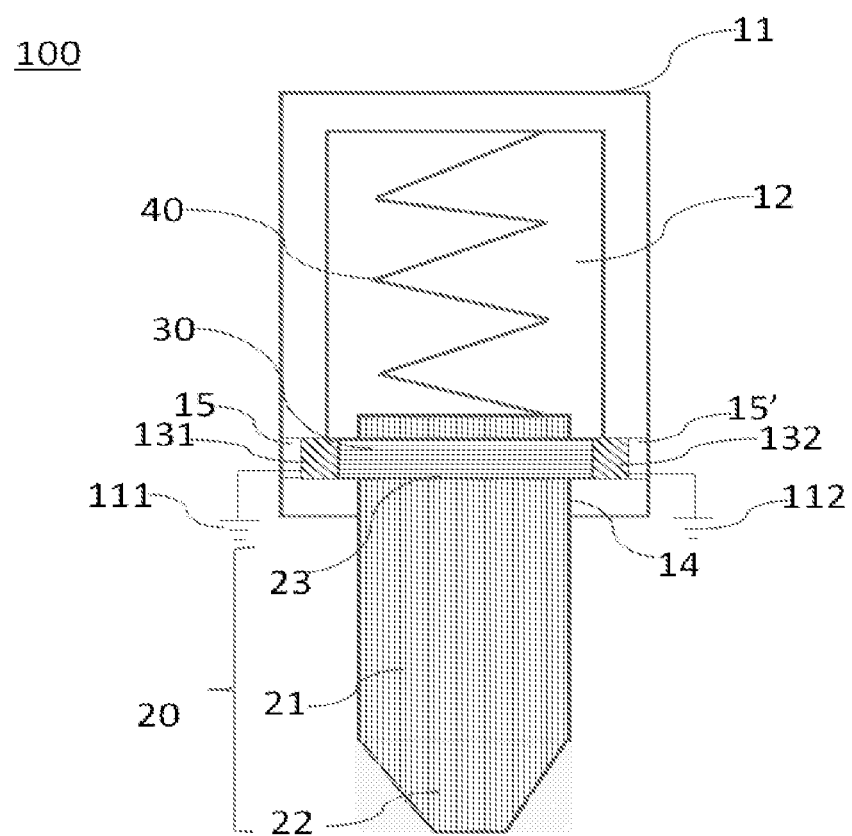
FIG. 3 is a cross-section diagram of the probe device according to a second embodiment of the present disclosure.
Figure 4:
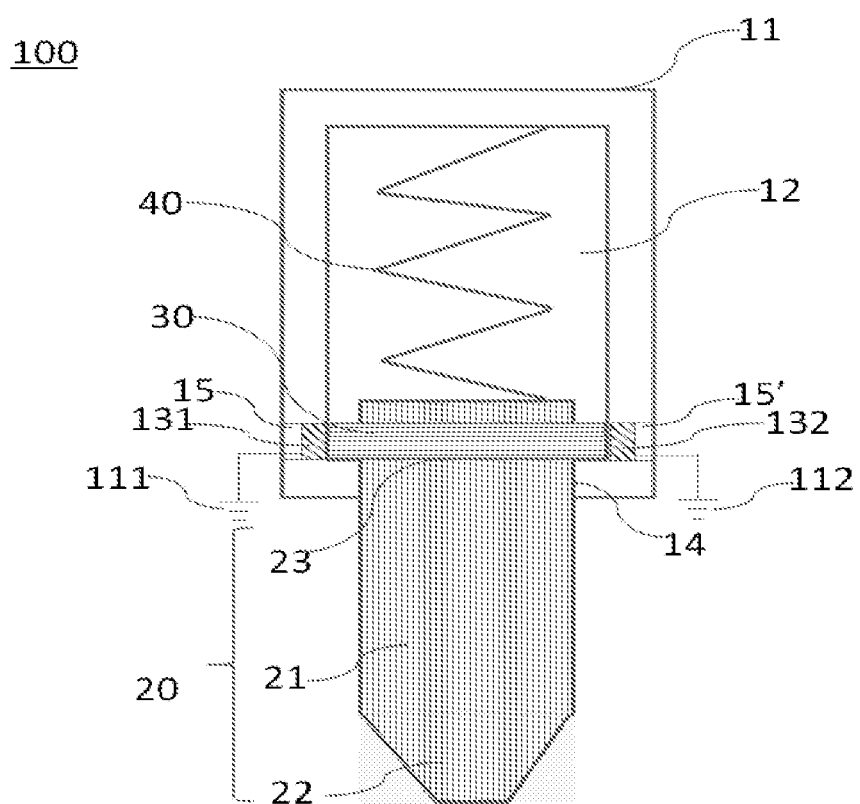
FIG. 4 is a cross-section diagram of the probe device according to a third embodiment of the present disclosure.

Please make reference to FIG. 3, which is a cross-section diagram of the probe device provided in the second embodiment of the present disclosure. The probe device 100 includes a base 10, a probe 20, a conductive member 30 and a elastic member 40. The second embodiment differs from the first embodiment in that the inner sides of the conductive contact 131 and 132 are convex toward the sidewalls of the cavity 12, so that the conductive member 30 contacts the conductive contact 131 and 132 fully, making the conduction of the charge accumulated during operation of the probe 20 to the ground more quickly and efficiently. The outer sides of the conductive contact 131 and 132 are not flush with the outer sidewalls of the main body 11, wires are set at the outer side of the conductive contacts 131 and 132, and are respectively connected to the ground wires 111 and 112, so that the charge of the probe 20 accumulated can be conducted to the ground by contacting the conductive member 30 with the conductive contact 131 and 132, thereby release the charge of the probe 20 accumulated. In some viable embodiments, as shown in FIG. 4, the cross-section diagram of the probe device provided in the third embodiment of the present disclosure, the inner sides of the conductive contact 131 and 132 are flush with the sidewall of the cavity 12, the outer sides of the conductive contact 131 and 132 are not flush with the sidewall of the main body 11. In other viable embodiments, the inner sides of the conductive contact 131 and 132 are slightly convex relative to the sidewalls of the cavity 12, the outer sides of the conductive contact 131 and 132 are flush with the sidewall of the main body 11.

In above embodiment, members like the conductive contact 131 and 132, and the conductive member 30 are defined according to the structure of the probe 20, to conduct the charge of the probe 20 accumulated to the ground by contacting the conductive member 30 with the conductive contact 131 and 132, and thereby to decrease the possibility of occurrence of Electro-Static Charge effectively and to increase the yield rate of Auto Contact.

In the several embodiments provided in the present disclosure, it is to be understood that the device disclosed can be implemented in other ways. Such as, the device embodiments described above are merely illustrative. For example, the division of the device is only according to structural function. In practice, there may be another division manner. For example, multiple devices or components may be combined or integrated in another device, or some features can be ignored or not executed. In addition, mutual coupling or direct coupling or communication connection that is shown or discussed in the disclosure may be indirect coupling or communication connection by the way of some interfaces, devices or modules, as well as other forms of connection such as electric or mechanical connection.

The foregoing are only specific embodiments of the present disclosure without limit to the protection scope of the present disclosure, and any equivalent modifications or substitutions obvious to the skilled in the art based on the present disclosure are within the protection scope of the present disclosure. Therefore, the protection scope of the present disclosure should be determined by the claims.

What is claimed is:

1. A probe device, comprising:
   a base, comprising a main body, a cavity formed in the main body, a conductive contact grounded and defined on the main body, and a through hole communicating with the cavity defined in the main body;
   a probe, comprising a main part, a probe head defined at one end of the main part, and a mounting portion defined at the other end of the main part, the mounting portion being inserted into the cavity of the base via the through hole;
   a conductive member, disposed in the cavity and defined on the mounting portion of the probe, allowing the mounting portion to be caught in the cavity; and
   an elastic member, disposed in the cavity, one end of the elastic member being connected to the main body at the side away from the through hole, the other end of the elastic member being connected with the mounting portion of the probe, the elastic member generating compressive deformation to separate the conductive member from the conductive contact when the probe is in operation,
   wherein, the conductive contact is defined on bottom of two opposite sidewalls of the main body, and a through opening for disposing the conductive contact is defined in each the bottom of the opposite sidewalls, and the conductive contact is shaped as arcuate cylinder, the inner side of the conductive contact is flushed with the sidewall of the cavity;
   the conductive member is in contact with the conductive contact to release the charge of the probe accumulated during operation of the probe, when the probe device is not in operation.

2. The probe device of claim 1, wherein the outer side of the conductive contact is flushed with the outer sidewall of the main body.

3. The probe device of claim 1, wherein the outer side of the conductive contact is not flushed with the outer sidewall of the main body.

4. The probe device of claim 1, wherein the elastic member is a spring.

5. The probe device of claim 1, wherein the conductive member is a conductive ring.

6. The probe device of claim 5, wherein the outer diameter of the conductive ring matches the size of the sidewall of the cavity.

* * * * *